United States Patent [19]
Wasserman
[11] 3,893,105
[45] July 1, 1975

[54] INTEGRATING TYPE ANALOG-DIGITAL CONVERTER

[75] Inventor: Philip D. Wasserman, Newbury Park, Calif.
[73] Assignee: Tekelec, Inc., Oxnard, Calif.

[22] Filed: Dec. 18, 1973
[21] Appl. No.: 425,753

Related U.S. Application Data

[63] Continuation-in-part of Ser. No. 249,077, May 1, 1972, abandoned.

[52] U.S. Cl. .......... 340/347 NT
[51] Int. Cl. .......... H03k 13/20
[58] Field of Search .......... 340/347 NT, 347 AD; 324/99 D

[56] References Cited
UNITED STATES PATENTS

| | | | |
|---|---|---|---|
| 3,659,288 | 4/1972 | Taylor | 340/347 NT |
| 3,662,376 | 5/1972 | Furukawa | 340/347 NT |
| 3,735,394 | 5/1973 | Eto | 340/347 NT |
| 3,765,012 | 10/1973 | Grutzediek | 340/347 NT |
| 3,768,009 | 10/1973 | Dorey et al. | 324/99 D |

*Primary Examiner*—Charles D. Miller
*Attorney, Agent, or Firm*—Jessup & Beecher

[57] ABSTRACT

An improved analog-digital converter of the integrating type is provided for converting analog input voltages into accurately related digital outputs. The system operates during a first time interval ($T_1$) such that the analog input voltage charges a capacitor in a linear manner. The first time interval ($T_1$) is subdivided into a plurality of successive time periods ($T_A$). If, at the end of any time period ($T_A$), the voltage across the capacitor exceeds a predetermined threshold, a reference current is introduced into the capacitor to reduce the charge. The process is repeated for each time period ($T_A$), whenever the voltage across the capacitor exceeds the threshold at the end of such period. During a second time interval ($T_2$), the charging input voltage is removed from the capacitor, and the reference current is again introduced into the capacitor until the capacitor is discharged to a second predetermined level. The times the reference current is turned on are accumulated in an output counter which provides the digital output.

11 Claims, 3 Drawing Figures

INTEGRATING TYPE ANALOG-DIGITAL CONVERTER

CROSS REFERENCE TO RELATED APPLICATION

This application is a continuation-in-part of copending application Ser. No. 249,077, filed May 1, 1972, and now abandoned for "Integrating Type Analog-Digital Converter."

BACKGROUND OF THE INVENTION

Integrating analog-digital converters, such as digital voltmeters, which produce a digital output signal that is representative of the time integral of an analog input signal, are known to the art. Such prior art converters require long conversion times to provide rejection of line frequency interference. Furthermore, such converters require large, expensive capacitors in the integrator circuit if high accuracy is desired. Also, such converters are limited in speed and accuracy by the gain, bandwidth and electrical noise of the comparator circuit.

The converter of this invention overcomes the major disadvantages of the prior art units. It allows a major increase in conversion rate while greatly reducing the value of the integrating capacitor and decreasing the gain-bandwidth requirements of the comparator circuit. The results are improvements in speed, accuracy, cost and complexity.

All the advantages of the prior art converters are retained such as accuracy independent of oscillator frequency and integration capacitor value drift, as well as high noise rejection.

DETAILED DESCRIPTION OF THE INVENTION

Figure 1:
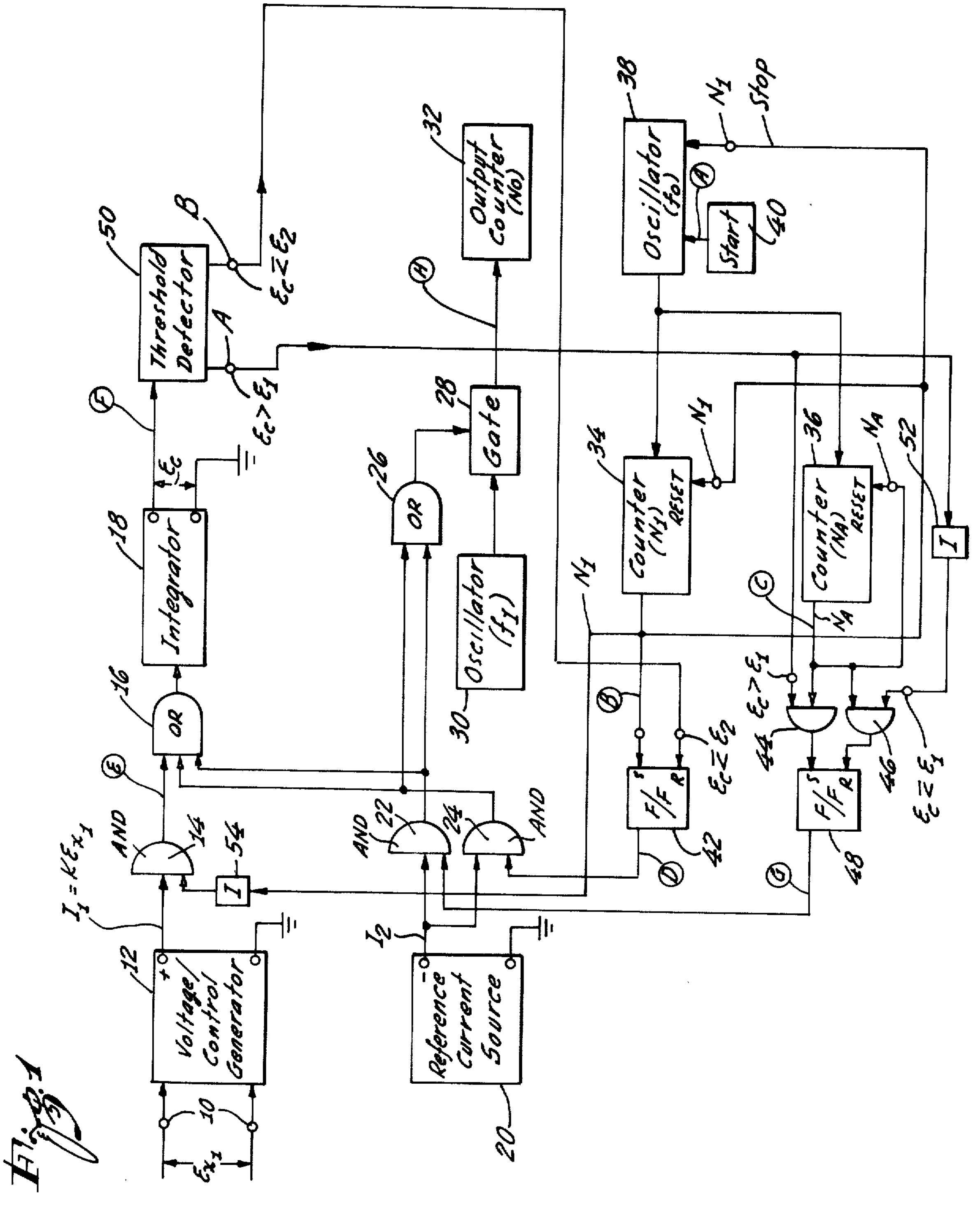
FIG. 1 is a block diagram schematically illustrating one embodiment of the invention.

In the system shown in FIG. 1, the input voltage $Ex_1$, representing the unknown analog quantity which is to be converted to a corresponding digital number is applied to input terminals 10. The input terminals 10 are connected to a voltage-to-current generator 12. The generator 12 may be any known type of circuit, and it serves to convert the input voltage into a current $I_1 = KEx_1$. In the particular embodiment, as shown by FIG. 1, the current $I_1$ is assumed to be positive.

The $I_1$ current is applied through an "and" gate 14 and through an "or" gate 16 to an integrator 18. The integrator 18 may be of any known type, and it includes a capacitor which is charged by the incoming current, and which develops a voltage $E_c$ at the output of the integrator.

A reference current source 20 of any known type is also provided. The reference current source produces a reference current $I_2$ which, in the illustrated embodiment, is considered to be negative. The current $I_2$ is applied to a pair of and gates 22 and 24. Both of the and gates 22 and 24 are connected to the or gate 16, and to a further or gate 26. The or gate 26 is connected to a gate 28 and, so long as the current $I_2$ is flowing into the integrator 18, the gate 28 is enabled permitting an oscillator 30 to drive an output counter 32. The oscillator 30 may be a usual free-running multivibrator which produces pulses at a recurring frequency ($f_1$). The output counter 32 is also designated $N_o$.

The system of FIG. 1 also includes further counters 34 and 36. The counter 34 is also designated $N_1$, and it is used to establish an interval $T_1$ during which the current $I_1$ flows into the integrator 18. The counter 36 is also designated $N_a$, and it is used to establish a plurality of successive sub-time periods within the interval $T_1$. Both the counters 34 and 36 may be driven by an oscillator 38. The oscillator 38 may also be a free-running multivibrator, and it may oscillate at a frequency $f_o$. The oscillator 38 may also be used to drive the output counter 32, through, for example, an appropriate frequency multiplier.

The system of FIG. 1 is put in operation, for example, by activating the oscillator 38 through an appropriate start circuit 40. The oscillator then drives the counters 34 and 36 until the counter 34 has reached the $N_1$ count, or some multiple thereof, corresponding to the time $T_1$. At that time, the counter 36 has been driven through a predetermined number of time sub-periods $N_a$. At the end of the time $N_1$, the counter 34 resets and the oscillator 38 is stopped. The counter 36, on the other hand, resets at the end of each time sub-period $N_a$.

The output of the counter 34 is applied to the set input terminal of a usual flip-flop 42, and also is used to reset the counter 34 after the $N_1$ count, and to stop the oscillator 38. The set output terminal of the flip-flop 42 is connected to the and gate 24. The output terminal of the counter 36, on the other hand, is connected to a pair of and gates 44 and 46. The and gate 44 is connected to the set input terminal of a flip-flop 48, and the and gate 46 is connected to the reset input terminal of the flip-flop. The flip-flop 48 is connected to the and gate 22. The output of the counter 36 is also used to reset the counter at the end of $N_a$ count.

The voltage $E_c$ developed at the output of the integrator 18 is connected to a threshold detector 50. The threshold detector 50 may be of any known type, and it produces an output at its terminal A whenever the voltage $E_c$ at the output of the integrator is greater than a particular voltage $E_1$, and the threshold detector develops an output at its terminal B whenever the voltage $E_c$ is less than a selected voltage $E_2$. The voltage $E_2$ is selected to be less than the voltage $E_1$. The output terminal A of the threshold detector is connected to the and gate 44 and, through an inverter 52, to the and gate 46. The terminal B of the threshold detector is connected to the reset input terminal of the flip-flop 42. The output of the counter 34 is also connected through an inverter 54 to the and gate 14.

In the operation of the system, the start circuit 40 introduces a pulse (A in FIG. 2) to the oscillator 38 to start the oscillator. The oscillator then drives the counters 34 and 36. At the end of $N_1$ cycles, the counter 34 generates an output pulse (B in FIG. 2) designating the end of the time interval $T_1$. During that time interval, the counter 36 produces a series of output pulses designating sub-time periods during the time interval $T_1$ (C in FIG. 2). The output pulse (B in FIG. 2) generated by the counter 34 is also used to reset the counter 34, as mentioned, and to stop the oscillator 38.

During the time $T_1$, the and gate 14 is enabled since the counter 34 has not yet achieved its count ($N_1$), so that the flip-flop 42 is reset. Therefore, during the input interval $T_1$, the current $I_1$ flows through the and gate 14 and through the or gate 16 (E in FIG. 2) into the integrator 18, producing a charge $Q_x$ on the capacitor C in the integrator. The magnitude of the charge is:

$$Q_x = \frac{I_1 T_1}{C} \quad (1)$$

Figure 2:
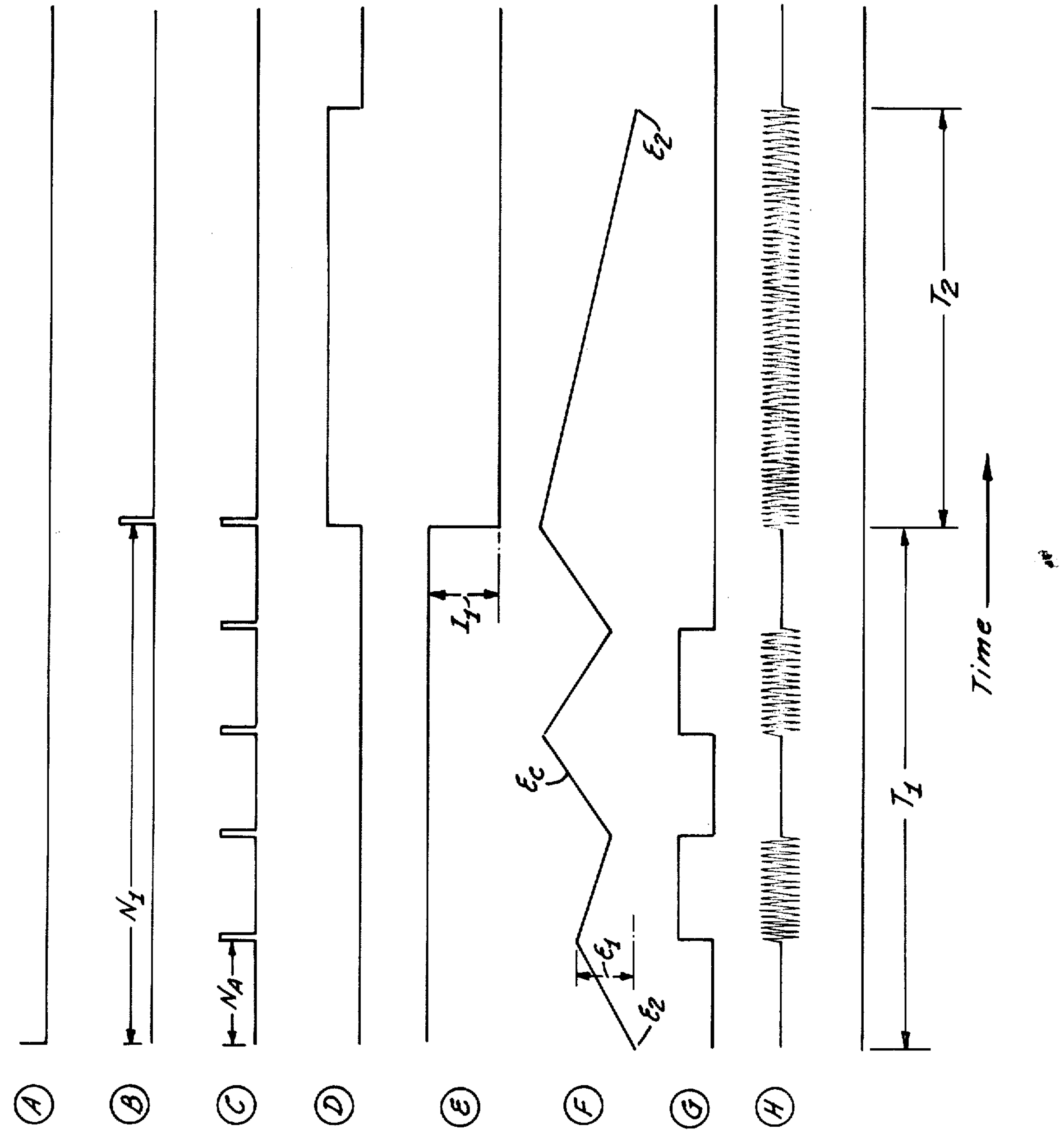
FIG. 2 is a series of curves useful in explaining the operation of the system of FIG. 1.

The time interval $T_1$ is subdivided into an integral number of sub periods of duration $T_1/A$, as represented by the curve C in FIG. 2. If at the end of any such sub period, the voltage $E_c$ exceeds $E_1$, as sensed by the threshold detector 50, then an output is produced at the output terminal A of the threshold detector which enables the and gate 44, so that the flip-flop 48 is set. This enables the and gate 22, and the reference current $I_2$ flows into the integrator. Since the current $I_2$ is of a polarity opposite to the current $I_1$, the voltage $E_c$ is reduced (curve F of FIG. 2), and an increment of charge $Q_r$ is removed from the capacitor C in the integrator where:

$$Q_r = \frac{-I_2 T_1}{N_a C} \quad (2)$$

After the increment of charge is removed, the capacitor C in the integrator 18 continues to be charged by the current $I_1$. If at the end of the next sub period $N_A$ the voltage $E_c$ again exceeds $E_1$, the foregoing process is repeated, as represented by the curve F of FIG. 2. The current $I_2$ is chosen so that at no time during the interval $T_1$ can the voltage $E_c$ become negative.

Assuming that the voltage $E_c$ was equal to $E_2$ at the start of the time interval $T_1$, and that $N_B$ units of charge equal to $Q_r$ were removed from the capacitor C in the integrator 18 during the time interval $T_1$, then, at the end of the time interval $T_1$, the voltage $E_c$ will be:

$$E_c = E_2 + \frac{I_1 T_1}{C} - \frac{N_B I_2 T_1}{N_A C} \quad (3)$$

During the time interval $T_2$, which follows immediately after the time interval $T_1$, the and gate 14 is disabled so that the current $I_t$ no longer flows into the integrator. During the interval $T_2$, however, the and gate 24 is enabled so that the reference current $I_2$ flows into the integrator. The flow of the current $I_2$ into the integrator reduces the voltage $E_c$ until a level of $E_2$ is reached, as sensed by the threshold detector 50. When the voltage $E_c$ reaches the level $E_2$, the flip-flop 42 is reset, cutting off the flow of the reference current $I_2$ into the integrator 18, and terminating the interval $T_2$. The voltage $E_c$ at the end of the terminal $E_2$ now equals $E_2$, so that:

$$E_2 = E_2 + \frac{I_1 T_1}{C} - \frac{N_B I_2 T_1}{N_A C} - \frac{I_2 T_2}{C} \quad (4)$$

Therefore, $$\frac{I_1 T_1}{C} - \frac{N_B I_2 T_1}{N_A C} - \frac{I_2 T_2}{C} = 0 \quad (5)$$

Therefore, $$I_1 T_1 - \frac{N_B T_1 I_2}{N_A} - I_2 T_2 = 0 \quad (6)$$

The time interval $T_1$ is generated by accumulating $N_1$ cycles of the oscillator 38 of frequency $F_o$. Therefore:

$$T_1 = \frac{N_1}{F_o} \quad (7)$$

Similarly, each of the sub periods of $T_1$ are determined by a smaller number of cycles, so that:

$$\frac{T_1}{N_A} = \frac{N_1}{F_o N_A} \quad (8)$$

Each time the reference current source is turned on, the gate 28 is enabled, so that the output counter 32 counts at a rate of $F_1 > K F_o$. Therefore, during each sub interval during time $T_1$, the output count $N_{o1}$ accumulated is:

$$N_{o1} = \frac{T_1 F_1}{N_A} \quad (9)$$

If it be assumed that $F_1 = K F_o$, then:

$$\frac{T_1}{N_A} = \frac{N_{o1}}{K F_o} \quad (10)$$

Substituting (7) and (10) into equation (6), we have:

$$\frac{I_1 N_1}{F_o} - \frac{N_B I_2 N_{01}}{K F_o} - I_2 T_2 = 0 \quad (11)$$

During the time interval $T_2$, the output counter also accumulates counts at a rate of $F_1$, due to the fact that the and gate 24 is enabled, therefore, during the interval $T_2$ the output count $N_{o2}$ accumulated is:

$$T_2 = \frac{N_{o2}}{F_1} \quad (12)$$

Substituting equation (12) into equation (11), we have:

$$\frac{I_1 N_1}{F_o} - \frac{I_2 N_B N_{01}}{K F_o} - \frac{I_2 N_{o2}}{K F_o} = 0 \quad (13)$$

Therefore, $$I_1 N_1 - \frac{I_2 N_B N_{01}}{K} - \frac{I_2 N_{o2}}{K} = 0 \quad (14)$$

Therefore, $$I_1 N_1 = \frac{I_2}{K} (N_B N_{o1} + N_{o2} \quad (15)$$

$$N_o = (N_B N_{01} + N_{o2}) \quad (16)$$

Therefore, $$N_o = \frac{I_1}{I_2} K N_1 \qquad (17)$$

From equation (17), it will be observed that the output number $N_o$, which equals $N_B N_{o1} + N_{o2}$, is directly proportional to the input current $I_1$, and therefore to the input voltage $E_{x1}$. It will also be observed from equation (15) that the output number $N_o$ is independent of the value of the capacitor C in the integrator 18, and of oscillator frequency, provided that these parameters remain constant during a conversion. Therefore, high accuracy may be achieved easily and simply, since there is no dependence upon high tolerances insofar as the aforesaid parameters are concerned.

In the system and circuit of the present invention, since the maximum voltage across the capacitor C in the integrator 18 represents the full scale charge divided by $N_B/2$, substantial simplification in the threshold detector 50 may be realized, as compared with the usual prior art dual slope converter. Moreover, the system of the present invention is capable of faster conversions, for a given circuit, as compared with the prior art dual slope converter, since the maximum duration of the time interval $T_2$ is divided by a factor $N_B/2$.

Since the accuracy of the system of the invention is independent of the voltage $E_2$, a feedback loop closed around the threshold detector 50 and the integrator 18 at the termination of a reading will insure that a measurement will start and finish precisely at the $E_2$ level, thereby eliminating the effects of temperature drift in the threshold detector.

Figure 3:
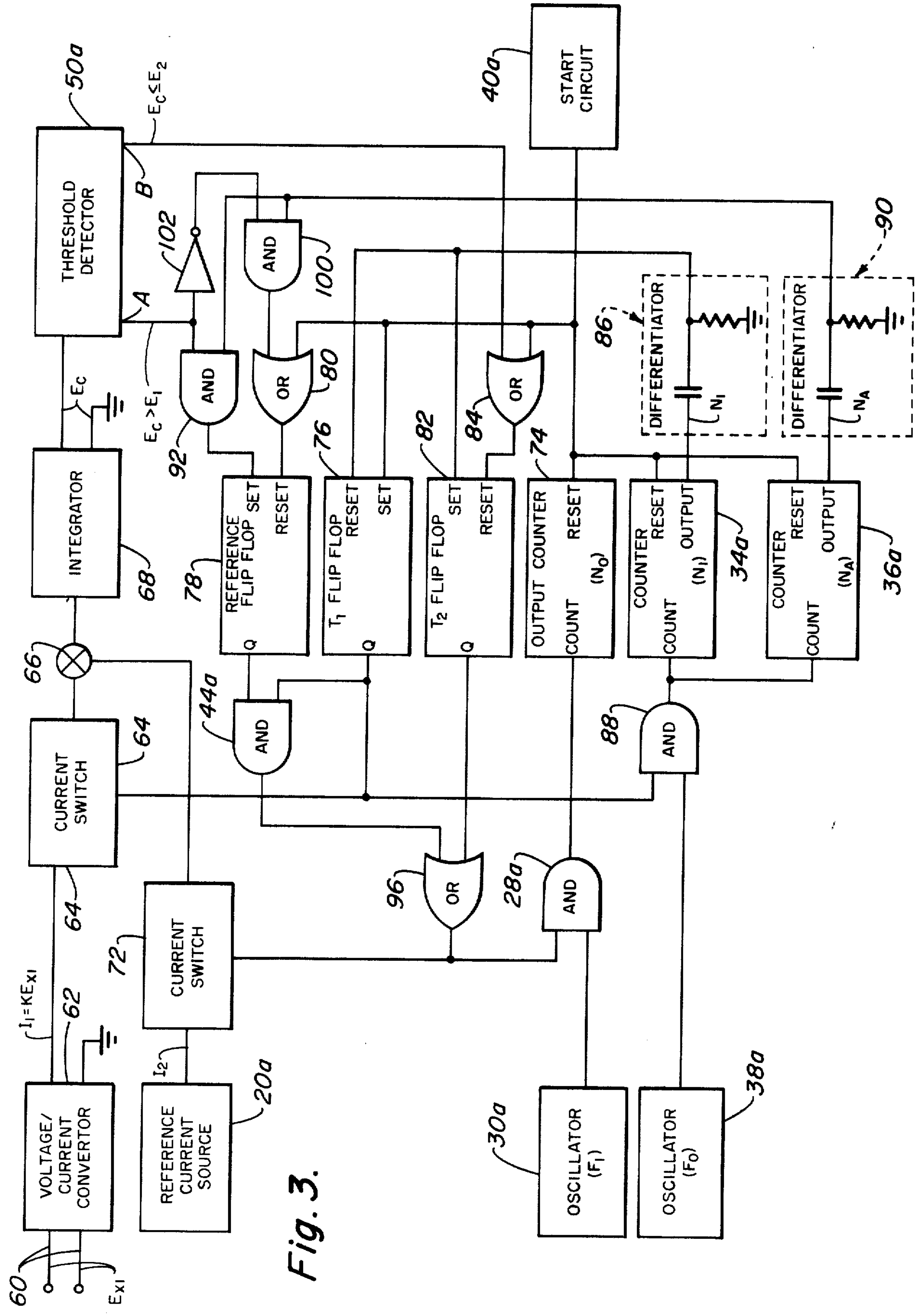
FIG. 3 is a block diagram schematically illustrating a second embodiment of the invention.

Referring to the system shown in FIG. 3, wherein like parts in FIG. 1 are identified by the same reference character, the input voltage $E_{x1}$, representing the unknown analog quantity which is to be converted to a corresponding digital number, is applied to input terminals 60. The input terminals 60 are connected to a voltage-to-current converter 62. The converter 62 may be any known type of circuit, and it serves to convert the input voltage into a current $I_1 = KE_{x1}$. In the particular embodiment of FIG. 3, the current $I_1$ is assumed to be positive.

The $I_1$ current is applied through a current switch 64 to the summing node 66 of an integrator 68 which can be the same as integrator 18 of FIG. 1. It includes a capacitor which is charged by the incoming current, and which develops a voltage $E_c$ at the output of the integrator.

A reference current source 20*a* produces a reference current $I_2$ which, in FIG. 3, is considered to be negative. The current $I_2$ is applied to a second current switch 72, the control input C of which is connected to gate 28*a* and, so long as the current $I_2$ is flowing into the integrator 68, the gate 28*a* is enabled permitting oscillator 30*a* to drive an output counter 74, which is also designated $N_o$. The system of FIG. 3 also includes counters 34*a* and 36*a*.

The system of FIG. 3 is put in operation, for example, by resetting counters 74, 34*a* and 36*a* with a short pulse from start circuit 40*a*, which simultaneously sets flip-flop 76, resets flip-flop 78 through or gate 80 and resets flp-flop 82 through or gate 84. The oscillator 38*a* then drives the counters 34*a* and 36*a* until the counter 34*a* has reached the $N_1$ count, or some multiple thereof, corresponding to the time $T_1$. At that time, the counter

36*a* has been driven through a predetermined number of time sub-periods $N_n$. At the end of the time $N_1$, the counter 34*a* produces a short pulse through differentiator 86 which resets flip-flop 76, thereby disabling and gate 88, stopping the counting process in counters 34*a* and 36*a*. The counter 36*a*, on the other hand, reaches a full count at the end of each time sub-period $N_n$ and returns to a count of zero on the next pulse from oscillator 38*a*. Thus, cach time a count of $N_n$ is reached and counter 36*a* returns to its zero count state during time interval $T_1$, a short pulse is issued through differentiator 90. If at this time, output A of threshold detector 50*a* is at a logical 1 ($E_c$ $E_1$), and gate 92 is enabled and a pulse is applied to the set input of flip-flop 78.

The Q output of 78 enables and gate 44*a* which operates through or gate 96 to enable reference current switch 72 and also to enable and gate 28*a*, allowing oscillator pulses from oscillator 38*a* to be passed to counter 74. Alternatively, if, when the pulse from differentiator 90 is issued, the output A of threshold detector 50*a* is in the zero state, and gate 100 is enabled by inverter 102 and the reset input of flip-flop 78 is pulsed through and gate 100 and or gate 80. Current switch 72 is therefore non-conductive and oscillator ($F_1$) 30*a* does not advance counter 74.

Therefore during time interval $T_1$, flip-flop 76 is in the 1 state. The state of flip-flop 78 is determined at the end of each sub-period, with its state for the subsequent sub-period determined by the state of the threshold detector at the instant that a pulse is issued by differentiator 90. If the threshold detector 50 is at a 1 state at this time, reference current is passed to the integrator 68, and oscillator pulses $F_1$ are accumulated by counter 74 during the subsequent sub-time interval. Conversely, if the threshold detector is at an 0 state when the pulse occurs, no reference current flows to the integrator 68, and no oscillator pulses are accumulated by counter 74 during the subsequent sub-time interval.

The voltage $E_c$ developed at the output of the integrator 68 is connected to threshold detector 50*a*, which produces an output at its terminal A that is connected to the and gate 92 and, through an inverter 102, to the and gate 100. The terminal B of the threshold detector 50*a* is connected to the reset input terminal of the flip-flop 82 through or gate 84. The output of the counter 34*a* is also connected through differentiator 86 to the "set" input of flip-flop 82 and the "reset" input of flip-flop 76.

In the operation of the system of FIG. 3, the start circuit 40*a* introduces a pulse (A in FIG. 2) which resets counters 74, 34*a* and 36*a*. In addition it resets flip-flops 78 and 82 and sets flip-flop 76. The oscillator 38*a* then drives the counters 34*a* and 36*a*. At the end of $N_1$ cycles, the counter 34*a* generates an output pulse through differentiator 86 (B in FIG. 2) designating the end of the time interval $T_1$. During that time interval, the counter 36*a* produces a series of output pulses through differentiator 90 designating sub-time periods during the time interval $T_1$ (C in FIG. 2). The output pulse (B in FIG. 2) generated by the counter 34*a* is also used to reset flip-flop 76 and set flip-flop 82, thereby terminating time interval $T_1$ and initiating time interval $T_2$.

During the time $T_1$, the current switch 64 is enabled since the counter 34*a* has not yet achieved its count ($N_1$), so that the flip-flop 76 is in the "set" state. Therefore, during the input interval $T_1$, the current $I_1$ flows through the current switch 64 (E in FIG. 2) into the integrator 68, producing a charge $Q_x$ on the capacitor C in the integrator.

The time interval $T_1$ is subdivided into an integral number of sub-periods of duration $T_1/A$, as represented by the curve C in FIG. 2. If at the end of any such sub-period the voltage $E_c$ exceeds $E_1$, as sensed by the threshold detector 50*a*, then an output is produced at the output terminal A of the threshold detector which enables the and gate 92, so that the flip-flop 78 is set by the next pulse C. This enables the and gate 44*a*, and the reference current $I_2$ flows into the integrator. Since the current $I_2$ is of a polarity opposite to the current $I_1$, the voltage $E_c$ is reduced (curve F of FIG. 2), and an increment of charge $Q_r$ is removed from the capacitor C in the integrator 68.

During the time interval $T_2$, which follows immediately after the time interval $T_1$, the current switch 64 is disabled so that the current $I_1$ no longer flows into the integrator 68. During the interval $T_2$, however, the current switch 72 is enabled so that the reference current $I_2$ flows into the integrator 68. The flow of the current $I_2$ into the integrator 68 reduces the voltage $E_c$ until a level of $E_2$ is reached, as sensed by the threshold detector 50*a*. When the voltage $E_c$ reaches the level $E_2$, the flip-flop 82 is reset, cutting off the flow of the reference current $I_2$ into the integrator 68, and terminating the interval $T_2$.

Each time the reference current source is turned on, the gate 28*a* is enabled, so that the output counter 74 counts at a rate of $F_1$. During the time interval $T_2$, the output counter 74 also accumulates counts at a rate of $F_1$, due to the fact that the and gate 28*a* is enabled.

It will be observed that the output number $N_o$, which equals $N_B N_{ot} + N_{o2}$, is again directly proportional to the input current $I_1$, and therefore to the input voltage $E_{x1}$, as has been described hereinbefore for the system of FIG. 1. The output number $N_o$ is again independent of the value of the capacitor C in the integrator 68, and of oscillator frequency, provided that these parameters remain constant during a conversion. Therefore, high accuracy is achieved easily and simply; again, since there is no dependence upon high tolerances insofar as the aforesid parameters are concerned.

As in the system of FIG. 1, a feedback loop in the system of FIG. 3 closed around the threshold detector 50*a* and the integrator 68 at the termination of a reading will insure that a measurement will start and finish precisely at the $E_2$ level, thereby eliminating the effects of temperature drift in the threshold detector and integrator circuits.

It will be appreciated that although particular embodiments of the invention have been shown and described, modifications may be made. For example, two configurations of counting circuitry are possible.

In a first configuration, such as shown in FIG. 1, the counter 34*a* ($N_1$) accumulates count of the oscillator 38*a* ($F_o$) to generate the time interval $T_1$, while another output counter 32*a* ($N_o$) is used to accumulate count of the oscillator 30*a*. The illustrated system permits a control of the K factor, that is the ratio between the frequency $F_1$ and the frequency $F_o$, thereby allowing digital control of scale factor, or generation of non-linear relationships between the input voltage $Ex_1$ and the output number $N_o$.

In a second configuration, K is set to unity by making $F_o$ and $F_1$ the same frequency, and by using, for example, a common oscillator to drive both the counters 32*a* and 34*a*.

In either configuration, simplification may be achieved if counter 36*a* ($N_A$) is merely the lowest order counting stages of counter 34*a* ($N_1$).

In the latter embodiment, the first counter is used during the time interval $T_1$ to generate the subdivisions of $T_1$; a second counter counts the subdivisions and terminates $T_1$ when the required number is reached; and a third counter counts the number of times during $T_1$ that the reference current is turned on. This third counter then contains the most significant digits of the output number. Then, during the time interval $T_2$, the first counter may be used to accumulate counter pulses until the $E_2$ level is reached, overflowing if necessary into the third counter. The first and third counters then contain the entire output number. It is clear that the latter approach achieves a reduction in the digital circuitry requirements, since its time shares the first counter.

It is intended in the claims to cover all such modifications, and any other modifications, which fall within the true spirit and scope of the invention.

What is claimed is:

1. An integrating type of analog-digital converter system comprising:

an input circuit for producing a current ($I_1$) corresponding to an unknown analog input signal;

an integrator circuit for producing an output voltage ($E_c$) in response to an input current;

first gate circuit means connecting said input circuit to said integrator circuit;

a reference current source for producing a reference current ($I_2$) of opposite polarity to said first-named current ($I_1$);

second gate circuit means connecting said reference source to said integrator circuit;

first pulse counter means connecting said reference source to said integrator circuit;

second pulse counter means for producing a digital output representative of the number of pulses applied thereto;

pulse generating means for generating a series of pulses;

third gate circuit means connecting said pulse generating means to said second pulse counter means and connected to said second gate circuit means to pass said pulses from said pulse generating means to said pulse counter means when said second gate circuit means passes said reference current ($I_2$) to said integrator circuit;

further circuitry connected to said first and second gate circuit means to enable said first gate circuit means and to disable said second gate circuit means during portions of a first, predetermined time interval ($T_1$) which is independent of said input current, so as to cause said first gate circuit means to pass said first-named current ($I_1$) to said integrator circuit during said first time interval ($T_1$), and to disable said first gate circuit means and enable said second gate circuit means during a second, predetermined time interval ($T_2$) so as to cause said second gate circuit means to pass said reference current ($I_2$) to said integrator circuit during said second time interval ($T_2$); and threshold detector means included in said further circuit means and connected to the output of said integrator circuit for causing said further circuitry to enable said second gate circuit means during sub-time periods within said first time interval ($T_1$) when the amplitude of said integrator output voltage ($E_c$) is below a selected voltage level ($E_1$) so as to introduce said reference current ($I_2$) to said integrator circuit during such sub-time periods concurrently with the introduction of said first-named current ($I_1$).

2. The converter system defined in claim 1, and which includes a first counter included in said further circuitry to establish said first time interval ($T_1$), and a second counter included in said further circuitry to establish said sub-time period within said first time interval.

3. The converter system defined in claim 1, and which includes a control network included in said further circuitry and connected to said threshold detector means for disabling said second gate circuit means during said second time interval ($T_2$) when the integrator output voltage ($E_c$) falls to a selected voltage level ($E_1$).

4. An integrating analog-digital converter system comprising:

an input circuit for producing an input current ($I_1$) corresponding to an unknown analog input signal, an integrator circuit for producing an input voltage ($E_c$) in response to a selected input current, first circuit means selectively connecting said input circuit to said integrator circuit, a reference current source for producing a reference input current ($I_2$) of opposite polarity to said input current ($I_1$), second circuit means selectively connecting said reference current source to said integrator circuit, pulse generating means for selectively generating a series of output pulses, first pulse counter means responsive to said output pulses to count said output pulses for a predetermined first time interval ($T_1$) and to enable said first circuit means for said first time interval ($T_1$) and to disable said first circuit means for a second time interval ($T_2$), second pulse counter means responsive to said output pulses for said first time interval ($T_1$) to count said output pulses for said first time interval ($T_1$) as a predetermined number of equal sub-time periods ($N_A$) within said first time interval ($T_1$) and to generate a sub-time period output pulse at the end of each sub-time period ($N_A$), third pulse counter means for producing a digital output representative of the number of output pulses from said pulse generating means applied to an input of said third pulse counter means, third circuit means responsive to said second circuit means and connecting said pulse generating means to said input of said third pulse counter means when said reference current source is selectively connected to said integrator circuit, and threshold detector means connected to said integrator circuit and responsive to said sub-time period output pulses and further responsive to said output voltage ($E_c$) to selectively enable said second gate circuit means during said equal sub-time periods ($N_A$) within said first time interval ($T_1$) when the amplitude of said output voltage ($E_c$) is greater than a first selected voltage level ($E_1$) so that said reference current ($I_2$) is introduced to said integrator circuit during said sub-time periods ($N_A$) concurrently with the introduction of said input current ($I_1$) to said integrator circuit, said threshold detector means further responsive to said output voltage ($E_c$) during said second time interval ($T_2$) to enable said second circuit means when the amplitude of said output voltage ($E_c$) is greater than said first selected voltage level ($E_1$) and to disable said second circuit means when the amplitude of said output voltage ($E_c$) during said second time interval ($T_2$) is no greater than a second selected voltage level ($E_2$).

5. The converter system of claim 4 in which said first pulse counter means during said second time interval ($T_2$) accumulates said output pulses to said second voltage level ($E_2$), whereupon said third pulse counter means accumulates said output pulses greater than said second voltage level ($E_2$) so that said first and third pulse counter means accumulate the total digital output representative of the number of output pulses from said pulse generating means.

6. The converter system of claim 4 in which said pulse generating means includes a first pulse generating means selectively connected through said third circuit means to said third pulse counter means and a second pulse generating means connected to said first and second pulse counter means.

7. The converter system of claim 4 in which said first pulse counter means includes a first differentiator interposed between a first pulse counter responsive to said output pulses and first and second flip-flops responsive to said first differentiator.

8. The converter system of claim 4 in which said second pulse counter means includes a second differentiator interposed between a second pulse counter responsive to said output pulses and a third flip-flop selectively responsive to said second differentiator.

9. The converter system of claim 7 in which said first differentiator is connected to a reset input of said first flip-flop and to a set input of said second flip-flop so that an output pulse generated by said first counter means at the end of said first time interval ($T_1$) resets said first flip-flop and sets said second flip-flop thereby initiating said second time interval ($T_2$).

10. The converter system of claim 8 in which said second differentiator is selectively connected to said third flip-flop through gate means enabled and disabled by said threshold detector so that the state of said third flip-flop is determined.

11. An integrating analog-digital converter system comprising:

input means for producing a current $I_1$ corresponding to an unknown analog input signal, integrator means for producing a voltage $E_c$ which is a function of the integrated current applied to said integrator means, $I_1$ control means for selectively applying $I_1$ to said integrator means, start circuit means for enabling said $I_1$ control means to institute said application of $I_1$ to said integrator means, reference current source means for producing a reference current $I_2$ of polarity opposite to $I_1$, $I_2$ control means for selectively applying $I_2$ to said integrator means, pulse generating means for generating a series of pulses, first pulse counter means for counting said pulses, and:

a. after a first time interval $T_1$, disabling said $I_1$ control means for applying $I_1$ to said integrator means, during a second time interval $T_2$ and until the next enabling of said $I_1$ control means by said start circuit means, b. after each sub-time interval of $T_1/N_A$, delivering a momentary inquiry signal, $N_A$ being an integer, c. registering said pulses during those intervals of time when said $I_2$ control means is applying $I_2$ to said integrator means, threshold detector means responsive to said $E_c$, for delivering to said $I_2$ control means during $T_1$:

a. an $I_2$ enabling signal for causing application of $I_2$ to said integrator means, in response to a said inquiry signal, if at that moment $E_c$ is greater than a predetermined reference voltage $E_1$, and b. an $I_2$ disabling signal in response to a said inquiry signal, if at that moment said $E_c$ is equal to or less than said predetermined reference voltage $E_1$, and for delivering, during $T_2$, and $I_2$ disabling signal whenever $E_c$ is equal to or less than another predetermined reference voltage $E_2$, means for applying an $I_2$ enabling signal to said $I_2$ control means, for applying $I_2$ to said integrator means during time $T_2$, means for applying said $I_2$ disabling signal to said $I_2$ control means, for stopping the application of $I_2$ to said integrator means, thereby to terminate $T_2$.

* * * * *